United States Patent
Nagai et al.

[11] Patent Number: 6,114,753
[45] Date of Patent: Sep. 5, 2000

[54] CIRCUIT TAPE HAVING ADHESIVE FILM, SEMICONDUCTOR DEVICE, AND A METHOD FOR MANUFACTURING THE SAME

[75] Inventors: Akira Nagai, Hitachi; Shuji Eguchi, Toukai-mura; Masahiko Ogino, Hitachi; Masanori Segawa, Hitachi; Toshiak Ishii, Hitachi; Nobutake Tsuyuno, Hitachi; Hiroyoshi Kokaku, Hitachi; Rie Hattori, Hitachinaka; Makoto Morishima, Hitachi; Ichiro Anjoh, Koganei; Kunihiro Tsubosaki, Hino; Chuichi Miyazaki, Akishima; Makoto Kitano, Tsuchiura; Mamoru Mita; Norio Okabe, both of Hitachi, all of Japan

[73] Assignees: Hitachi, Ltd.; Hitachi Cable, Ltd., both of Tokyo, Japan

[21] Appl. No.: 08/857,674

[22] Filed: May 16, 1997

[30] Foreign Application Priority Data

May 30, 1996 [JP] Japan ................................. 8-136159

[51] Int. Cl.⁷ ......................... H01L 23/485; H01L 23/495
[52] U.S. Cl. ..................... 257/668; 257/778; 257/783; 257/782; 438/107; 438/123
[58] Field of Search ................................. 257/668, 778, 257/782, 783; 438/118, 125, 107, 123

[56] References Cited

U.S. PATENT DOCUMENTS

| | | | |
|---|---|---|---|
| 5,561,323 | 10/1996 | Andros et al. | 257/707 |
| 5,668,405 | 9/1997 | Yamashita | 257/668 |
| 5,800,758 | 9/1998 | Topolkaraev et al. | 264/154 |
| 5,866,949 | 2/1999 | Schueller | 257/778 |
| 5,895,965 | 4/1999 | Tanaka et al. | 257/668 |

*Primary Examiner*—Leo P. Picard
*Assistant Examiner*—Hung Van Duong
*Attorney, Agent, or Firm*—Antonelli, Terry, Stout & Kraus, LLP

[57] ABSTRACT

A semiconductor device having a superior connection reliability is obtained by providing a buffer body for absorbing the difference of thermal expansion between the mounting substrate and the semiconductor element in a semiconductor package structure, even if an organic material is used for the mounting substrate. A film material is used as the body for buffering the thermal stress generated by the difference in thermal expansion between the mounting substrate and the semiconductor element. The film material has modulus of elasticity of at least 1 MPa in the reflow temperature range (200–250° C.).

23 Claims, 5 Drawing Sheets

Fan Out TYPE

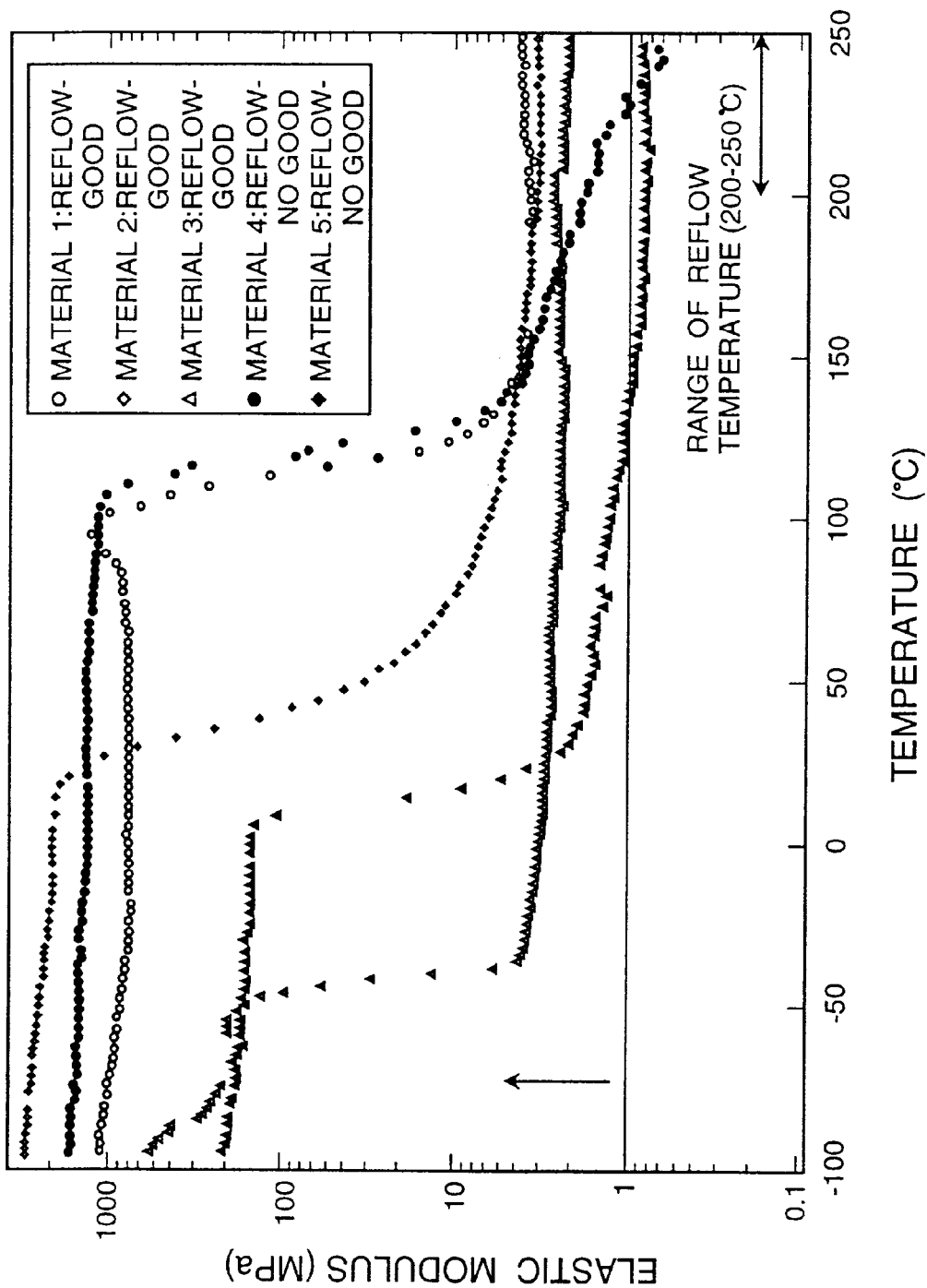

Fan In TYPE

Fan Out TYPE

Fan In/Out TYPE

CIRCUIT TAPE HAVING ADHESIVE FILM, SEMICONDUCTOR DEVICE, AND A METHOD FOR MANUFACTURING THE SAME

BACKGROUND OF THE INVENTION

The present invention relates to a circuit tape, a semiconductor device, and a method of manufacturing the same, which are superior in electrical characteristics, mounting reliability, and assembling easiness, and are responsive to the requirements for high density mounting, multipins mounting, and fast transmittance.

Currently, in the continuing effort to improve electronic devices to provide high performance, the demand for high integration and high density mounting of semiconductor elements has become strong. Therefore, semiconductor elements have been improved to achieve high integration and high performance, such as in LSI, VLSI, and ULSI devices, and there has been increase in the capacity, the number of pins, the speed, and power consumption thereof. In responding to such advances, the package structure of the semiconductor device for multipins has been changed from a structure, in which connecting terminals are provided at two sides of the semiconductor element, to an advanced structure, in which the connecting terminals are provided at all four sides of the semiconductor element. Furthermore, in order to respond to increasing the number of pins, a grid array structure has come to be used in practice. The grid array structure is a structure of a semiconductor element, in which the connecting terminals are provided in a grid array over the entire mounting surface of the semiconductor element by using a multilayer carrier substrate. The grid array structure includes a ball grid array structure (BGA), which has a shortened connecting terminal length in order to make fast signal transmission possible. The ball type structure of the connecting terminal increases the width of its conductor; therefore, the ball structure is also effective in decreasing inductance. Currently, in order to respond to the requirement for fast signal transmission, organic materials having a relatively low dielectric constant have been investigated for use in the multilayer carrier substrate. However, the organic materials have generally a larger thermal expansion coefficient than the semiconductor element, and so thermal stress generated by the difference in thermal expansion becomes a problem from the point of view of connection reliability, and so on. Recently, a structure which does not use a carrier substrate has been proposed for the BGA package.

More particularly, a new semiconductor element package structure has been disclosed (U.S. Pat. No. 5,148,265), in which the connection reliability is improved by using an elastomer material having a low modulus of elasticity for reducing the thermal stress generated by the difference in thermal expansion between the semiconductor element and the mounting substrate. The proposed package structure uses a circuit tape composed of a polyimide and the like, instead of a carrier substrate, for electrically connecting the semiconductor element and the mounting substrate. Therefore, the electrical connections between the semiconductor element and the circuit tape are effected by a wire bonding method or a bonding connection with leads, and the circuit tape and the mounting substrate are electrically connected by soldering ball terminals. As the elastomer material of the prior art, a silicone material is generally used since this is a material having a low modulus of elasticity and a superior heat resistance. As a general method for forming a stress buffer layer with a silicone material, the steps of printing an uncured liquid resin on the circuit tape using masks, and subsequently, curing the printed resin, are generally used. However, the above method has problems, such as a difficulty in maintaining the flatness of the buffer layer obtained by the printing, and the complexity of the printing process, which requires a long time for the printing, is disadvantageous. Accordingly, the above method is not suitable for a mass-production process, and so the problems which undesirably affect the assembling yield and reliability of mounting caused by the difficulty in maintaining the flatness of the buffer layer are yet to be solved.

SUMMARY OF THE INVENTION

One of the objects of the present invention is to provide a method of obtaining a stress buffer layer which is superior in flatness by using a film material as the elastomer material for reducing the thermal stress in the semiconductor devices, thereby obtaining semiconductor devices which are superior in mass productivity.

In order to realize the above object, the present invention provides the following measures;

The measures can be achieved by providing a semiconductor device comprising a circuit tape having a pattern layer connected electrically to a semiconductor element, an external terminal provided on the circuit tape for electrically connecting the circuit tape to a mounting substrate, and film material for causing the circuit tape to adhere to the semiconductor element while maintaining an insulation condition between the circuit tape and the semiconductor element, wherein the film material for effecting the adhering has a physical property such that the modulus of elasticity that is, elastic modulus of the film material in the temperature range of a solder reflow condition for mounting (200–250° C.) is at least 1 MPa.

The above film material for effecting the adhering is passed through a process for forming an external terminal, such as a solder ball and the like, for connecting the mounting substrate and the circuit tape, or a solder reflow process for mounting the semiconductor element of the present invention onto a mounting substrate in the manufacturing process of the semiconductor devices. The reflow temperature is generally a high temperature in the range of 200–250° C. Therefore, if the semiconductor device contains moisture, the moisture evaporates during the heat treatment, and the film material swells due to the vapor pressure of the moisture. When the swelling exceeds a threshold value, a foaming phenomenon is generated, and defects, such as void formation, delamination, and the like, are generated. Therefore, the film material to be used is required to have as low a moisture absorption rate as possible and a high modulus of elasticity in the range of the reflow temperature. In accordance with the present invention, various film materials have been studied, and it was found that the adhesive materials having a modulus of elasticity in the temperature range of a reflow process of at least 1 MPa had superior reflow characteristics. Several examples of the temperature dependence of the modulus of elasticity of the material are shown in FIG. 1.

Furthermore, it was found that when materials, of which the modulus of elasticity in the temperature range of the mounting reflow condition was maintained at least at 1 MPa, were used, a preferable result in the anti-reflow characteristics could be obtained. The amount of swelling depends on the ratio of the vapor pressure and the modulus of elasticity, and the higher the modulus of elasticity is, the less will be the amount of swelling. The foaming phenomenon is generated when the amount of swelling exceeds the break elongation, one of the mechanical properties of the material. Furthermore, the modulus of elasticity correlates with the mechanical strength of the adhesive film material, and generally, the higher the modulus of elasticity is, the greater will be the tendency to increase the break stress and break elongation. Therefore, by using a material having a high modulus of elasticity in the range of the reflow temperature, the reflow characteristics can be improved as to both the swelling amount and the mechanical characteristics. In the above case, the adhesive film material may be either a thermosetting resin or a thermoplastic resin.

The adhesive layer is sometimes composed of either sticky adhesive agents or sticky-cohesive adhesive agents, in addition to the adhesive agents made of the above material. In order to maintain the modulus of elasticity at least at 1 MPa in the temperature range of the reflow process, the thermoplastic resin preferably has a glass transition temperature, i.e. a changing point of modulus of elasticity, which is higher then the temperature range (200–250° C.) of the reflow process. The thermosetting resin is required to have a chemical or physical crosslinking structure to a certain degree at a temperature in the rubber region, which is higher than the glass transition temperature. That is, the modulus of elasticity in the rubber region is generally proportional to the crosslinking density, and the crosslinking density must be increased in order to increase the modulus of elasticity. The film material is desirably composed of a resin having a low modulus of elasticity which is at the utmost 4000 MPa at room temperature, in order to operate as a stress buffer layer.

As one of characteristics of a film material, the coefficient of moisture absorption at 85° C./85% RH for 168 hours is desirably, at the utmost, 3% in view of the reflow characteristics. As the film material, materials having a low modulus of elasticity, except for a silicone material, can be used. The structure of the film material is not restricted to a homogeneous structure composed of an adhesive agent component, but also, for instance, a three layer structure having adhesive layers at both surfaces of a supporter, respectively, or a structure in which the adhesive agent is impregnated into a porous supporter, can be used. As shapes of the film, various shapes manufactured by stamping, a mesh-like shape, and the like can be used. The mesh-like shape is effective in improving the anti-reflow property at the moisture absorbing time, because the adhesion area can be decreased.

In the case of a multilayer structure represented by a three layer structure, the supporter and the adhesive layer can be composed of a combination of at least two kinds of the above adhesive agents, the sticky adhesive agents, the sticky-cohesive adhesive agents, and the like. The adhesive layer is located at each of both of the surfaces of the supporter, and each adhesive layer can be formed of a different kind of material from the other. For instance, a combination is usable in which a thermosetting resin having a high fluidity is used in order to flatten or eliminate the unevenness of the pattern layer of the circuit tape side, and a thermoplastic resin, which can be adhered in a short time at a high temperature, is used at the opposite flat portion for adhering to the semiconductor element.

A set of schematic illustrations indicating a flow of a general fabrication process for the manufacture of semiconductor devices, according to the present invention, is shown in FIG. 2, showing manufacturing Methods 2-a, 2-b and 2-c.

The process can be divided into three representive sections. The first one, Method 2-a, including STEPS 1–5 is a method for fabricating a semiconductor element comprising (1) the step 1 of applying an adhesive film 2.2 to the tape 2.1 having a pattern layer, (2) the step 2 of adhering the tape 2.1 having a pattern layer to the semiconductor element 2.3 by means of the adhesive film 2.2 while maintaining an insulating condition therebetween, (3) the step 3 of electrically connecting the pattern layer formed on the tape 2.1 and the pad 2.6 on the semiconductor element 2.3 via connecting lead 2.1.1', formed from wire 2.1.1, (4) the step 4 of sealing the electrically connected portion with an insulating agent (e.g., mold resin) 2.4, and (5) the step 5 of forming an external terminal 2.5 on the tape 2.1 for connection to the mounting substrate.

The above method is effective in improving the processability, because the circuit tape and the film material can be handled in the manner of a reel to reel process, as will be explained later.

The second one, Method 2-b, including STEPS 6–10, is a method for fabricating a semiconductor element comprising (1) the step 6 of applying an adhesive film 2.2 to the semiconductor element 2.3 (2) the step 7 of adhering the tape 2.1 having a pattern layer to the semiconductor element 2.3 by means of the adhesive film 2.2 while maintaining an insulating condition therebetween, (3) the step 8 of electrically connecting the pattern layer formed on the tape 2.1 and the pad 2.6 on the semiconductor element 2.3 via connecting lead 2.1.1', formed from wire 2.1.1, (4) the step 9 of sealing the electrically connected portion with an insulating agent 2.4, and (5) the step 10 of forming an external terminal 2.5 on the tape 2.1 for connection to the mounting substrate.

The above method is effective in improving the production yield of the semiconductor element itself. In accordance with the method, the stress buffer layer can be formed on the semiconductor element at the wafer stage condition.

The third one, Method 2-c, including STEPS 11–14, (FIG. 2c), is a method of fabricating a semiconductor element comprising (1) the step 11 of setting the tape 2.1 having the pattern layer in registration and adhering the tape 2.1 to the semiconductor element 2.3 using the adhesive film 2.2 simultaneously with maintaining an insulating condition therebetween, (2) the step 12 of electrically connecting the pattern layer formed on the tape 2.1 and the pad 2.6 on the semiconductor element 2.3 via connecting lead 2.1.1', formed from wire 2.1.1, (3) the step 13 of sealing the electrically connected portion with an insulating agent 2.6, and (4) the step 14 of forming an external terminal 2.5 on the tape 2.1 for connection to the mounting substrate.

The above method is effective in shortening the manufacturing time, because the number of steps in the process can be decreased.

These methods essentially comprise the following steps. The adhesive film material of the present invention is provided between the tape material having the pattern layer and the semiconductor element by adopting a certain method, and the tape material and the semiconductor element are bonded together simultaneously or sequentially under conditions of designated temperature, pressure, and time. Subsequently, the pattern layer on the tape is electrically connected to the connecting pad of the semiconductor element. As examples of a connecting method using a connecting lead previously formed on the circuit tape as a circuit for connection with the semiconductor element, any one of a single point bonding method, a gang bonding method, and the like can be used.

As another example of a method for connection, a method in which the pattern layer and the semiconductor element are connected with wire bonding can be adopted.

Then, the connecting portion is encapsulated with an insulating material, and finally the external terminals, which are electrically connected with the mounting substrate, are formed on the circuit tape. As an external terminal, a solder ball is generally used, and most of the solder ball is formed by plating. Metals which may be used for the plating are gold, nickel, copper, solder, and the like.

In order to improve the mass productivity in the manufacturing process, the process for integrating the adhesive film material with the circuit tape previously as shown in Method 2-a is important.

As a general method for the above process, a method comprising the steps of transferring the tape, whereon the pattern is formed, by a long reel apparatus, stamping out the adhesive film into a designated shape, and adhering the adhesive film of the designated shape onto the circuit tape, as shown in FIG. 3, is effective for mass production. Shown in FIG. 3 is reel 3.1 for the long circuit tape and reel 3.2 for the adhesive film. Punching jig 3.3, and adhesive film 3.4 on the circuit tape, are also shown in FIG. 3. When the adhesive film is made of a thermosetting resin, the adhesive film can be made to adhere to the circuit tape while in an uncured A stage or a half-cured B stage. The resin is then further cured to a condition of a final-cured C stage during the step of adhering the obtained circuit tape, to which the adhesive film is attached, to the semiconductor element. Otherwise, if the adhesive agent reaches the condition of the final cured C stage during the time that the adhesive film is adhered to the circuit tape, sometimes, an adhesive layer is newly formed on the cured film portion.

As a method for forming the adhesive layer, an application method, a film adhering method, and the like are generally used. The adhesive component is desirably not sticky at room temperature, but if sticky, a mold releasing paper and the like is used.

FIG. 4 shows an example of the composition of a circuit tape to which an adhesive film is attached. The circuit tape 4.1 can be adhered to the semiconductor element. If a thermosetting resin is used for the adhesive layer 4.2 at the circuit tape side and a thermoplastic resin is used for the adhesive layer 4.3 at the side adhered to the semiconductor element, the circuit tape having the adhesive ability shown in FIG. 4 can be provided readily. Structure represented by reference character 4.1.1 of FIG. 4 shows a wire from which the connecting lead to the semiconductor element is formed.

When the adhesive layer is composed of a thermoplastic, sticky, or cohesive material, the conditions for the two steps to adhere to the circuit tape and to the semiconductor element can be set as quite the same with respect to each other. As opposed to the case of a thermosetting resin, the curing reaction does not need to be controlled at the intermediate stages, and so a manufacturing process superior in workability can be provided.

When the adhesive layer is composed of a sticky or cohesive material, the material is advantageous from the point of view of avoiding warpage of the semiconductor element, because the material can be adhered at room temperature. When the adhesive film is initially combined with the circuit tape, the semiconductor element is easily registered at the time of adhering to the circuit tape. Accordingly, the jigs of the adhering apparatus can be simplified, and the method becomes advantageous for mass production.

With the semiconductor device relating to the present invention, the unevenness of the pattern circuit on the circuit tape is sometimes eliminated by filling spaces with the adhesive layer of the film. In this case, the suitability of the adhesive layer for the filling can be confirmed at the step of combining the circuit tape and the semiconductor element. Therefore, an unsuitable adhesive layer can be eliminated before joining the circuit tape to the semiconductor element, a loss of the semiconductor can be avoided, and an advantageous increase in the production yield can be attained.

Typical examples of a thermosetting resin and a thermoplastic resin for the adhesive component of the film materials are as follows: epoxy resin, polyimide resin, polyamide resin, cyanate resin, isocyanate resin, fluorine-containing resin, silicon-containing resin, urethane resin, acrylate resin, styrene resin, maleimide resin, phenolic resin, unsaturated polyester resin, diallyl phthalate resin, cyanamide resin, polybutadiene resin, polyamideimide resin, polyether resin, polysulfone resin, polyester resin, polyolefine resin, polystyrene resin, polyvinyl chloride, transpolyisoprene resin, polyacetal resin, polycarbonate resin, polyphenylene ether resin, polyphenylene sulfide resin, polyacrylate resin, polyether imide resin, polyether sulfone resin, polyether ketone resin, liquid crystalline polyester resin, polyallylether nitrile resin, polybenzoimidazole resin, various kinds of polymer blend, and polymer alloys, and the like.

The above examples of a thermosetting resin and a thermoplastic resin involve materials having an adhesiveness resulting from melting or softening of the material by heating. On the contrary, the sticky or cohesive materials are materials having an adhesiveness produced by pressurizing.

Typical examples of the sticky and cohesive materials are as follows: various rubber groups, such as the silicone group, the butadiene group and the isoprene group, acrylate groups, polyvinyl ether groups, and the like. The cohesive material includes a room temperature curing type, a type cured by heat, ultraviolet ray irradiation, electron beam irradiation, and the like, a type cured by concurrent use of an accelerator, and the like. The room temperature curing type includes a moisture-reactive type which reacts in the presence of moisture in the atmosphere, a photo-reactive type which contains a photo-initiator, and an anti-oxygen material which contains peroxide, and the like. The thermosetting resin generally includes a crosslinking agent, such as thiurum groups, phenol groups, isocyanate groups, and the like, and adhesive components are crosslinked three-dimensionally to form the adhesive layer at a designated temperature.

The material of the type cured by ultraviolet ray irradiation, or electron beam irradiation, contains various photo-initiators. The material of the type cured by concurrent use of an accelerator includes a solution containing a reaction accelerator and a crosslinking agent, which are applied onto the surface of the sticky layer, wherein the adhesive layer is finally formed by mixing the above two agents with a contact pressure and reacting the two agents sequentially. For the cohesive agent of the present invention, a thermosetting resin is relatively preferable. Using a thermosetting resin, a semiconductor device, which is superior in mass productivity and reliability, can be provided by the method comprising the steps of registering the circuit tape and the semiconductor element at room temperature, bringing the wiring tape and the semiconductor element into contact to form a set, and elevating the temperature of a plurality of such sets to a designated degree simultaneously in a container, such as a constant temperature bath, for producing a curing reaction to ensure the adhesive strength.

The modulus of elasticity (that is, elastic modulus) of the adhesive film material is preferably high at a high temperature region in view of the reflow characteristics, but as low as possible at room temperature. In this regard, the semiconductor element and the mounting substrate generally have different thermal expansion coefficients from each other, and a thermal stress is generated, when the mounting is performed, at the external terminal, which is composed of a solder ball and the like. Then, the reliability of the connection becomes remarkably important.

If the modulus of elasticity of the adhesive film existing between the semiconductor element and the mounting substrate is low, the region of the adhesive layer becomes a stress buffer layer, and this is advantageous from the point of view of the connection reliability. The modulus of elasticity (that is, elastic modulus) at room temperature is desirably, at the utmost, 4000 MPa. More preferably, the modulus of elasticity (that is, elastic modulus) in the entire range of the heat cycling test (−55° C.–150° C.) is, at the utmost, 2000 MPa. As a material which has a high modulus of elasticity at a high temperature and a relatively low elastic modulus in a range of a low temperature including room temperature, sometimes silicone group materials are used. A film material comprising a silicone group material is one of the significantly important materials of the present invention.

However, film materials, other than the silicone group material having the above characteristics, are advantageous in comparison with the silicone group material. That is, because of the weak cohesive energy of silicon, cyclic low molecular weight silicone group compounds are gradually decomposed thermally during a long heat treatment, such as during storing at a high temperature (for instance, at least 150° C.), and this sometimes becomes a cause of contamination to the environment.

The composition of the film material of the present invention is not only a homogeneous structure composed of the adhesive agent components, but also may be a three layer structure, such as a supporter having adhesive agent layers at both surfaces for instance, and a structure in which the adhesive agent is impregnated into a porous supporter. As the supporter of the film material, films or a porous material made of polyimide, epoxy, polyethylene terephthalate, cellurose, acetate, fluorine-containing polymer, and the like can be used.

As the shape of the film, the various shapes obtainable by stamping out, a mesh-like shape, and the like can be used. The mesh-like shape is effective in improving the anti-reflow properly at the moisture absorbing time, because the adhesion area can be decreased. The three layer structure can be controlled to an arbitrary thickness and as to the kind of the adhesive layer provided at both the surfaces of the supporter, and the fluidity of the adhesive layer at the time of adhesion can be readily controlled. Furthermore, the presence of an insulating layer is ensured by the supporter located between the adhesive layers.

The value of vapor pressure of the adhesive material by moisture absorption at the time of reflow can be maintained at a low value by using the material, of which the film material has a coefficient of moisture absorption at 85° C./85% RH of, at the utmost, 3%, and so preferable reflow characteristics can be obtained.

The tape having a pattern layer is generally composed of a flexible circuit substrate. That is, a polyimide group material serving as the insulating layer, an epoxy group material, a polyimide group material, a phenolic group material, a polyamide group material, and the like are used as the adhesive layer with the conductor. Generally, copper is used as the conductor. As the wiring circuit, the copper is sometimes coated with nickel, gold plating, and the like. As the flexible circuit substrate, a material, which does not use the adhesive layer with the conductor, but uses a copper layer formed directly onto the polyimide insulating layer, is sometimes used.

The tape having a pattern layer is sometimes composed of a multilayer wiring structure. In this case, a voltage layer, a ground layer, and so on in addition to the signal layer can be formed in the circuit tape, and so a semiconductor device which is superior in electric characteristics can be provided.

Two typical arrangements of the pad terminal on the semiconductor element for electrically connecting the tape material having the pattern layer with the semiconductor element are as follows.

The one is a peripheral pad arrangement as shown in FIG. 5. FIG. 5 shows semiconductor element 5.1, and pads 5.1.1. In this case, there are different types of structure for the arrangement of the external terminals of the semiconductor device, as shown in FIGS. 6-1, 6-2, 6-3. That is, the case wherein the external terminals are located under the semiconductor element 6.3 (Fan In type, FIG. 6-1, the case wherein the external terminals are located outside the semiconductor element 6.3 (Fan Out type, FIG. 6-2), and the case wherein the external terminals are located at both under and outside the semiconductor element 6.3 (Fan In/Out type, FIG. 6-3) can be used.

Another example of the pad arrangement is the central arrangement shown in FIG. 7. FIG. 7 shows semiconductor element 5.1, and pads 5.1.1. In this case, the semiconductor device is composed of the structure shown in FIG. 8.

In accordance with the present invention, the semiconductor element is a device wherein IC, LSI, and the like, such as memories, logic devices, gate arrays, customs, power transistors, and the like, are formed on a wafer comprising semiconductor materials such as Si, GaAs, and the like, and the device has terminals for connecting to a lead, bump, and the like.

In accordance with the present invention, the semiconductor device comprising a tape having a pattern layer is used as an interconnection between the semiconductor element and the mounting substrate, which is superior in anti-reflow characteristics and connection reliability, may be provided by using a film material having a modulus of elasticity of at least 1 MPa in the reflow temperature region (200–250° C.), which is a high temperature region, as the adhesive material while maintaining the insulation between the circuit tape and the semiconductor element. By using such a film material, a manufacturing method which is superior in mass productivity to the conventional printing methods can be provided.

BRIEF DESCRIPTION OF THE DRAWINGS

These and other objects, features and advantages of the present invention will be understood more clearly from the following detailed description with reference to the accompanying drawings, wherein:

FIG. 1 is a graph indicating temperature dependency of the modulus of elasticity of materials;

FIGS. 6-1, 6-2, 6-3 are schematic cross sections showing the structure of semiconductor devices using the semiconductor elements having the peripheral pads;

Figure 2:
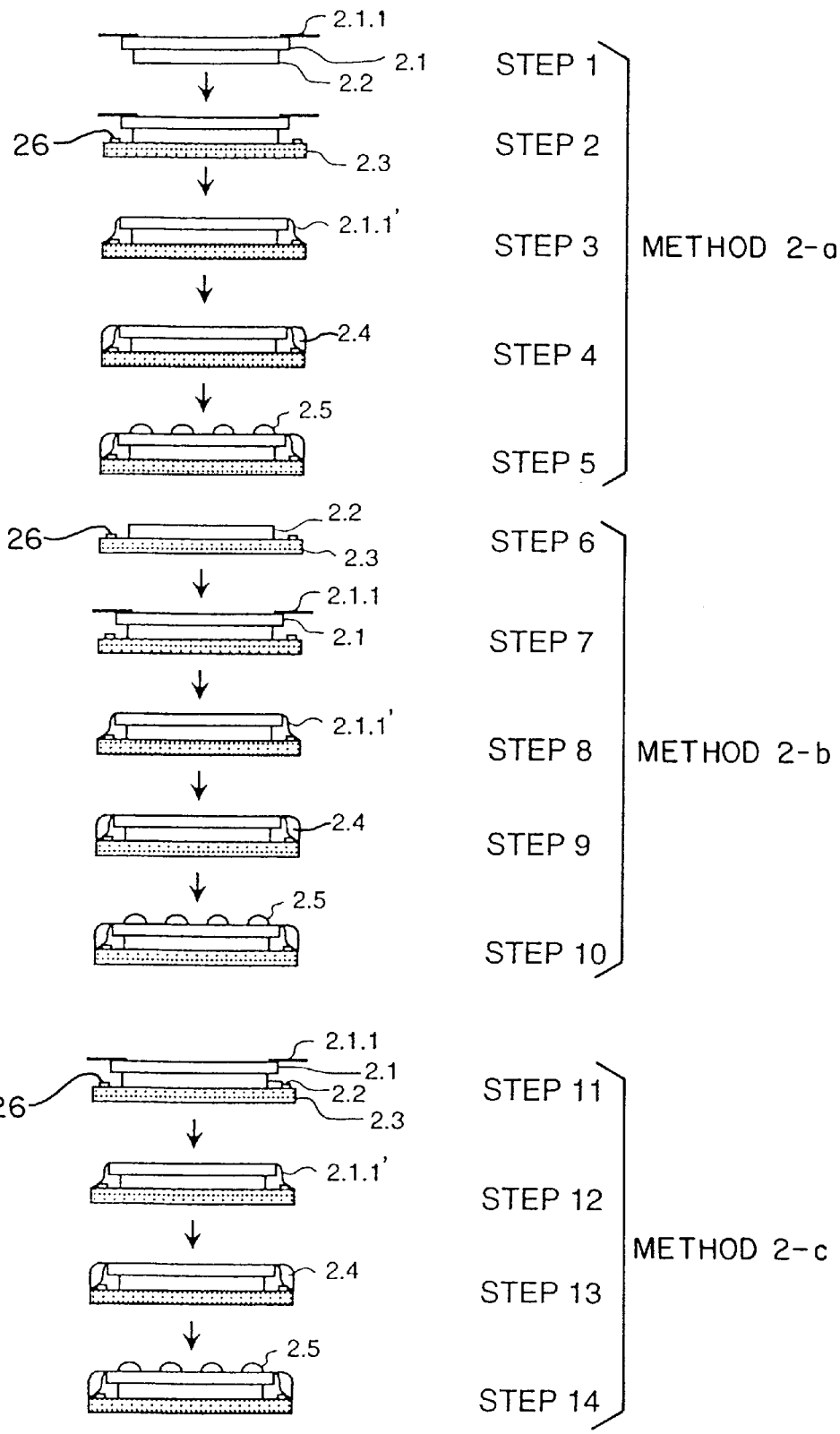
FIG. 2 is a schematic illustration indicating three manufacturing processes of the semiconductor device of the present invention, wherein shown Steps 1–5 indicate manufacturing Method 2-a wherein the film is adhered previously to the circuit tape, shown Steps 6–10 indicate manufacturing shows a Method 2-b wherein the film is adhered previously to the semiconductor element, and shown Step 11–14 indicate manufacturing Method 2-c wherein the circuit tape and the semiconductor element are adhered together simultaneously via the film.

DESCRIPTION OF THE PREFERRED EMBODIMENTS (Embodiment 1)

An epoxy group adhesive film 6.2 (made by Hitachi Chemical Co., Ltd., AS 3000, 50 μm thick) was registered, placed, and adhered between a semiconductor element 6.3 and circuit tape 6.1 at 170° C. for one minute with a pressure of 50 kgf/cm$^2$, and was then post-cured at 180° C. for 60 minutes in a constant temperature bath. Subsequently, connecting leads on the circuit tape 6.1 were electrically connected to pads of the semiconductor element by single point bonding. The connecting portion was encapsulated with an epoxy encapsulant 6.4 (made by Hitachi Chemical Co., Ltd., RC021C). Finally, the semiconductor device shown in FIG. 6-1 was obtained by fixing the solder balls, which were connecting terminals 6.5 with the mounting substrate, onto the circuit tape 6.1.

After absorbing moisture in a constant temperature bath at 85° C./85% RH for 168 hours, the obtained semiconductor device was set in an infrared reflow apparatus with a maximum temperature of 245° C., and it was confirmed whether the semiconductor device exhibited defects, such as delamination and voids by foaming the adhesive layer. Furthermore, the connection reliability between the lead of the semiconductor device and the solder bump was confirmed. In this case, a woven glass-epoxy copper clad laminate FR-4 (made by Hitachi Chemical Co., Ltd., MCI-E-67) was used as the mounting substrate. The reliability was evaluated by performing a thermal cycling test (−55° C.← →150° C., 1000 times).

(Embodiment 2)

Figures 1, 6:
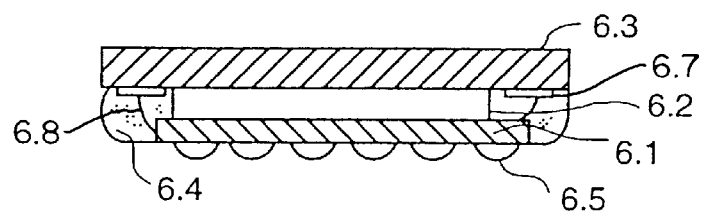
Figures 2, 6:
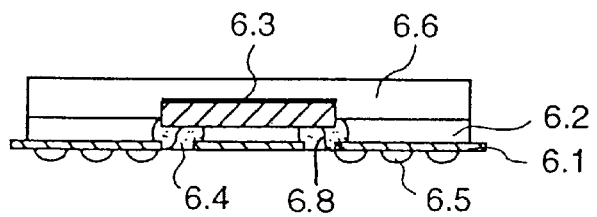
Figures 3, 6:
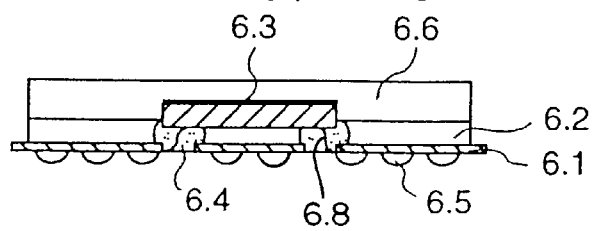
Figure 7:
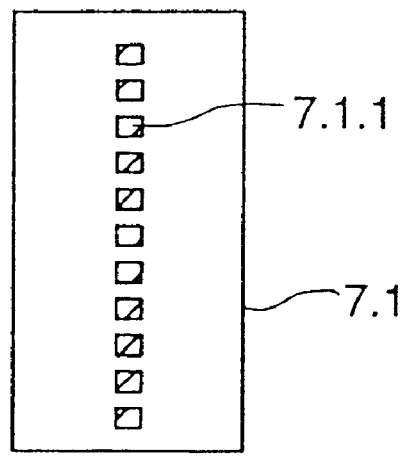
FIG. 7 is a schematic diagram showing a semiconductor element having pads located at the center of the element.

Film material 6.2 having a three layer structure was obtained by applying an adhesive agent (made by Hitachi Chemical Co. Ltd., DF335), composed of a die bonding film material, onto both surfaces of a polyimide film (made by Ube Kosan Co., Ltd., SGA, 50 μm thick) to a thickness of 50 μm. The obtained film material 6.2 was registered and adhered to circuit tape 6.1 at 170° C. for five seconds with a pressure of 30 kgf/cm$^2$. Under the above conditions, the unadhered adhesive layer exhibited a sufficient adhesive force to adhere to the semiconductor element 6.3. The circuit tape 6.1 attached with the film material 6.2 was adhered to the semiconductor element 6.3 at 200° C. for one minute with a pressure of 30 kgf/cm$^2$, and was then post-cured at 200° C. for 60 minutes in a constant temperature bath. Subsequently, connecting leads on the circuit tape 6.1 were electrically connected to pads 6.7 of the semiconductor element, via connecting lead 6.8, by gang bonding. The connecting portion was encapsulated with an epoxy encapsulant 6.4 (made by Hitachi Chemical Co., Ltd., RC021C). Finally, the semiconductor device shown in FIG. 6-2 was obtained by fixing the solder balls, which served as connecting terminals 6.5 with the mounting substrate, onto the circuit tape 6.1. Also shown in FIG. 6-2 is outer frame 6.6.

The reflow characteristics and connection reliability of the lead and the solder bump of the obtained semiconductor device were confirmed by the same method as the embodiment 1.

(Embodiment 3)

Figure 3:
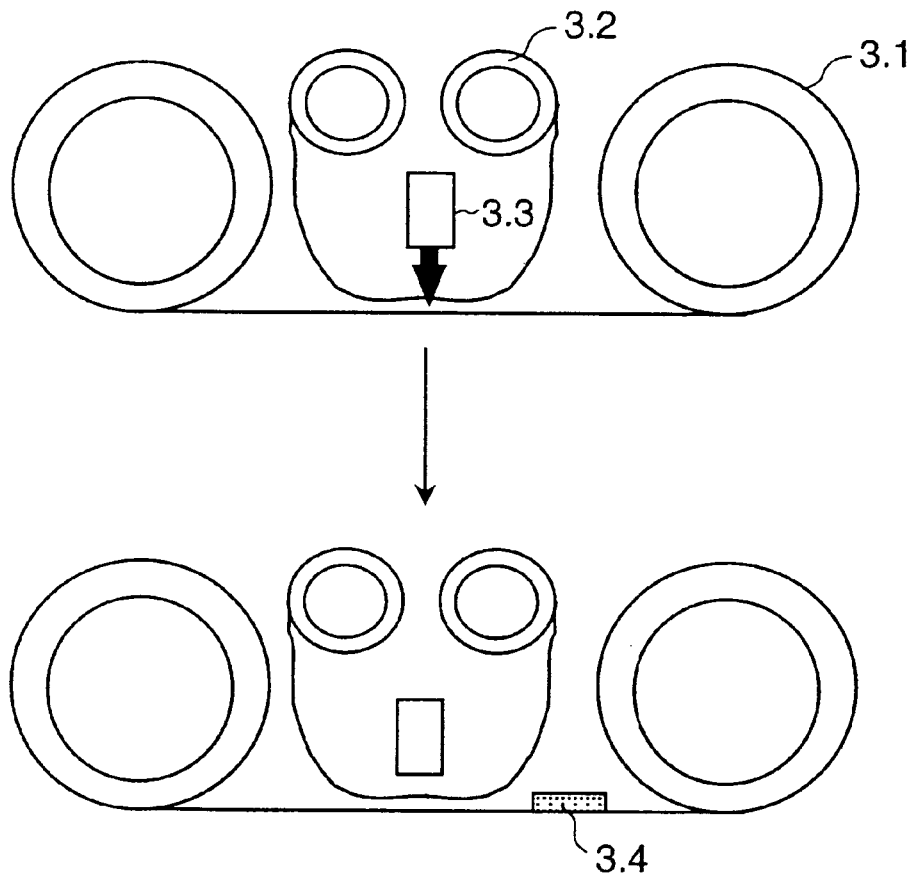
FIG. 3 is a schematic diagram indicating the continuous process for adhering the film using a long reel.
Figure 4:
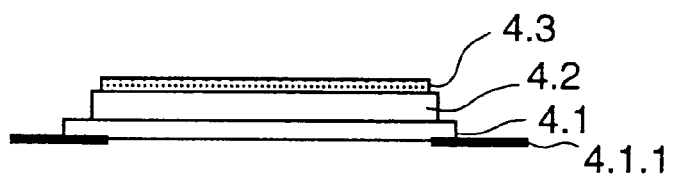
FIG. 4 is a schematic diagram showing a cross section indicating the composition of a circuit tape having a film with an adhesive agent layer.
Figure 5:
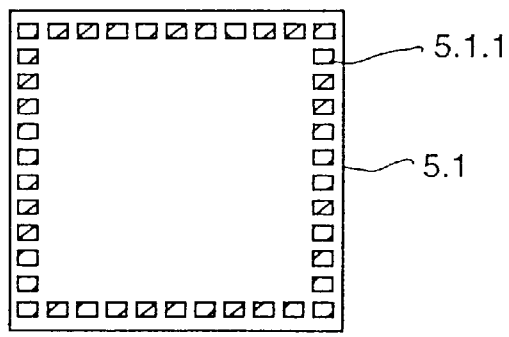
FIG. 5 is a schematic diagram of a semiconductor element having peripheral pads.

A low elastic adhesive film 6.2 composed of an epoxy resin and acrylic rubber (made by Hitachi Chemical Co. Ltd., trial product, 150 μm thick) was registered, placed, and adhered between the semiconductor element 6.3 and the circuit tape 6.1 at 180° C. for 30 seconds with a pressure of 100 kgf/cm$^2$, and was then post-cured at 180° C. for 60 minutes in a constant temperature bath. Subsequently, connecting leads 6.8 on the circuit tape 6.1 were electrically connected to pads of the semiconductor element 6.3 by wire bonding. The connecting portion was encapsulated 6.4 with a silicone encapsulant (made by Toshiba Silicone Co., Ltd., TSJ 3150). Finally, the semiconductor device shown in FIG. 6-3 was obtained by fixing the solder balls, which served as connecting terminals 6.5 with the mounting substrate, onto the circuit tape 6.1. Also shown in FIG. 6-2 is outer frame 6.6.

The reflow characteristics and connection reliability of the lead and the solder bump of the obtained semiconductor device were confirmed by the same method as the embodiment 1.

(Embodiment 4)

Figure 8:
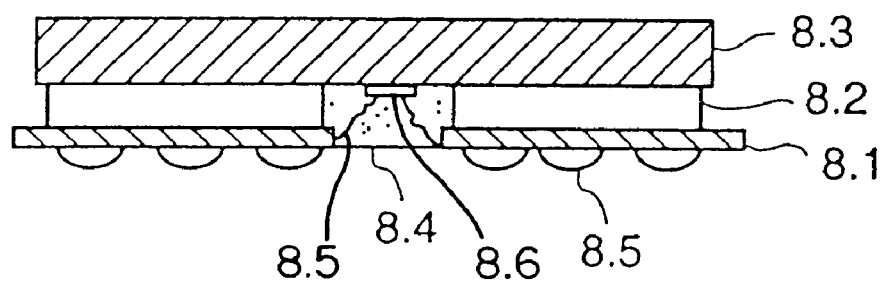
FIG. 8 is a schematic cross section showing the structure of a semiconductor device using a semiconductor element having pads located at the center of the element.

A film material having a three layer structure was obtained by adhering a low elastic adhesive film composed of epoxy resin and acrylic rubber (made by Hitachi Chemical Co. Ltd., trial product, 50 μm thick) to both surfaces of a woven glass-epoxy resin laminate (obtained by eliminating a copper cladding by etching from both surfaces of MCL-E-679 made by Hitachi Chemical Co., Ltd.). The film material was registered, placed, and adhered between the semiconductor element and the circuit tape at 200° C. for 20 seconds with a pressure of 80 kgf/cm$^2$, and was then post-cured at 180° C. for 60 minutes in a constant temperature bath. Subsequently, connecting leads on the circuit tape were electrically connected to pads of the semiconductor element by single point bonding. The connecting portion was encapsulated with a silicone encapsulant (made by Toshiba Silicone Co., Ltd., TSJ 3153). Finally, the semiconductor device shown in FIG. 8 was obtained by fixing the solder balls, which serve as connecting terminals with the mounting substrate, onto the circuit tape.

The reflow characteristics and connection reliability of the lead and the solder bump of the obtained semiconductor device were confirmed by the same method as the embodiment 1.

(Embodiment 5)

A LOC (Lead on chip) Film (made by Hitachi Chemical Co. Ltd., HM122U, 100 μm thick) having a three layer structure was registered and adhered to the circuit tape at 300° C. for 2 seconds with pressure of 150 kgf/cm$^2$. In the adhering process, the film was stamped out into a designated shape using the long scale apparatus shown in FIG. 3, and the stamped film was adhered to the circuit tape continuously. Because the adhesive layer of the film was made of a thermoplastic resin, the unadhered portion of the adhesive layer still had a sufficient adhering force to the semiconductor element.

The circuit tape with the film material was adhered to the semiconductor element at 300° C. for 10 minutes with a pressure of 100 kgf/cm². Subsequently, connecting leads on the circuit tape were electrically connected to pads of the semiconductor element by single point bonding. The connecting portion was encapsulated with an epoxy encapsulant (made by Hokuriku Toryo Co., Ltd. Chip coat 8107). Finally, the semiconductor device shown in FIG. 6-1 was obtained by fixing the solder balls, which served as connecting terminals with the mounting substrate, onto the circuit tape.

The reflow characteristics and connection reliability of the lead and the solder bump of the obtained semiconductor device were confirmed by the same method as the embodiment 1.

(Embodiment 6)

A thermoplastic polyimide film (made by Mitsui Toatsu Chemicals, Inc., Regulus PI-UAY, 100 μm thick) was registered and adhered to the semiconductor element at 250° C. for 2 seconds with a pressure of 30 kgf/cm². The film had a sufficient adhesive force to adhere to the circuit tape.

The semiconductor element with the film material was adhered to the circuit tape at 250° C. for 10 minutes with a pressure of 20 kgf/cm². Subsequently, connecting leads on the circuit tape were electrically connected to pads of the semiconductor element by wire bonding. The connecting portion was encapsulated with an epoxy encapsulant (made by Hokuriku Toryo Co., Ltd. Chip coat 8107). Finally, the semiconductor device shown in FIG. 6-2 was obtained by fixing the solder balls, which served as connecting terminals with the mounting substrate, onto the circuit tape.

The reflow characteristics and connection reliability of the lead and the solder bump of the obtained semiconductor device were confirmed by the same method as the embodiment 1.

(Embodiment 7)

A film material composed of a three layer structure having two different kinds of adhesive layers was obtained by applying a fluorine-containing polyimide (a reactant of hexafluorobisphenol AF and bis(4-aminophenoxyphenyl) hexafluoropropane, glass transition temperature 260° C.) onto one surface of a polyimide film (made by Ube Kosan Co. Ltd., SGA, 50 μm thick) to a thickness of 50 μm, and a polyetheretherketone (a reactant of dihydroxy-naphthalene and difluorobenzophenone, glass transition temperature 154° C.) onto the other surface of the polyimide film to a thickness of 50 μm.

The obtained film material was registered and adhered to the circuit tape using the adhesive layer having a lower glass transition temperature. The adhesion condition was at 200° C. for one minute with a pressure of 30 kgf/cm². Because the adhesive layer of the film was composed of a thermoplastic resin, the adhesive layer had a sufficient adhering force to adhere to the semiconductor element. The circuit tape with the film material was adhered to the semiconductor element at 300° C. for ten seconds with a pressure of 80 kgf/cm². Subsequently, connecting leads on the circuit tape were electrically connected to pads of the semiconductor element by gang bonding. The connecting portion was encapsulated with an epoxy encapsulant (made by Hokuriku Toryo Co. Ltd., Chip coat 8107). Finally, the semiconductor device shown in FIG. 6-3 was obtained by fixing the solder balls, which served as connecting terminals with the mounting substrate, onto the circuit tape.

The reflow characteristics and connection reliability of the lead and the solder bump of the obtained semiconductor device were confirmed by the same method as the embodiment 1.

(Embodiment 8)

A silicone adhesive agent (made by Shinetsu Chemical Co. Ltd., KE1820) was applied onto one surface of a silicone film (made by Toray Dow Corning Silicone Co. Ltd., JCR6126, 150 μm thick, press-fabrication) to a thickness of 20 μm. Then, the silicone film was registered and adhered to the circuit tape 8.1. The adhesion condition was at 150° C. for one minute with a pressure of 30 kgf/cm². Furthermore, in order to adhere to the semiconductor element, the silicone adhesive agent (made by Shinetsu Chemical Co. Ltd., KE1820) was applied onto the other surface of the silicone film to a thickness of 20 μm, whereby adhesive film 8.2 as a whole is provided, and the circuit tape 8.1 attached with the film material was adhered to the semiconductor element 8.3. The adhesion condition was at 200° C. for 30 seconds with a pressure of 20 kgf/cm². Subsequently, connecting leads 8.5 on the circuit tape 8.1 were electrically connected to pads 8.6 of the semiconductor element 8.3 by gang bonding. The connecting portion was encapsulated 8.4 with a silicone encapsulant (made by Toray Dow Corning Silicone Co. Ltd., DA 6501). Finally, the semiconductor device shown in FIG. 8 was obtained by fixing the solder balls, which serve as connecting terminals 8.5 with the mounting substrate, onto the circuit tape.

The reflow characteristics and connection reliability of the lead and the solder bump of the obtained semiconductor device were confirmed by the same method as the embodiment 1.

(Embodiment 9)

Porous polytetrafluoroethylene (made by Japan Gore-tex Inc., 190 μm thick), both surfaces of which were applied with BT resin (Bismaleimide-Triazine resin), was registered and adhered to the circuit tape. The adhesion condition was at 150° C. for one minute with a pressure of 30 kgf/cm². Because the adhesive layer of the film was in a B stage condition (half-cured condition), the adhesive layer had a sufficient adhering force to adhere to semiconductor element. The adhesion of the circuit tape with the film material to the semiconductor element was conducted at 200° C. for 2 minutes with a pressure of 70 kgf/cm². Subsequently, connecting leads on the circuit tape were electrically connected to pads of the semiconductor element by gang bonding. The connecting portion was encapsulated with an epoxy encapsulant (made by Hitachi Chemical Co., Ltd. R021C). Finally, the semiconductor device shown in FIG. 6-1 was obtained by fixing the solder balls, which were connecting terminals with the mounting substrate, onto the circuit tape.

The reflow characteristics and connection reliability of the lead and the solder bump of the obtained semiconductor device were confirmed by the same method as the embodiment 1.

(Embodiment 10)

A sticky tape having a three layer structure (made by Teraoka Seisakusyo, Ltd., Tape No. 760, 145 μm thick, silicone adhesive agent was applied onto both surfaces of Kapton film (commercial name by Du Pont)) was registered and adhered to the circuit tape at room temperature for 5 seconds with a pressure of 50 kgf/cm². In the adhering process, the film was stamped out into a designated shape using the long scale apparatus shown in FIG. 3, and the stamped film was adhered to the circuit tape continuously. Because the adhesive layer of the film was made of a sticky resin, the unadhered portion of the adhesive layer still had a sufficient adhering force to adhere to the semiconductor element.

The circuit tape with the film material was adhered to the semiconductor element at room temperature for 10 seconds with a pressure of 5 kgf/cm². Subsequently, connecting leads on the circuit tape were electrically connected to pads of the semiconductor element by single point bonding. The connecting portion was encapsulated with a silicone encapsulant (made by Toshiba Silicone Co. Ltd. TSJ 3150). Finally, the semiconductor device shown in FIG. 6-2 was obtained by fixing the solder balls, which serve as connecting terminals with the mounting substrate, onto the circuit tape.

The reflow characteristics and connection reliability of the lead and the solder bump of the obtained semiconductor device were confirmed by the same method as the embodiment 1.

(Embodiment 11)

A cohesive tape having a three layer structure (150 µm thick, butadiene adhesive agent was applied onto both surfaces of unwoven aramide cloth (100 µm thick)) was registered and adhered between semiconductor and circuit tape at room temperature for 5 seconds with a pressure of 50 kgf/cm². Under the above condition, some correction of the registration was possible, because the adhesive layer was still in a cohesive condition. Then, the adhesive layer of the film was cured at 180° C. for 60 minutes in a constant temperature bath to form a connecting state having a three dimensional crosslinking structure, because the adhesive layer was made of a cohesive resin.

Subsequently, connecting leads on the circuit tape were electrically connected to pads of the semiconductor element by single point bonding. The connecting portion was encapsulated with a silicone encapsulant (made by Toshiba Silicone Co., Ltd. TSJ 3150). Finally, the semiconductor device shown in FIG. 6-3 was obtained by fixing the solder balls, which serve as connecting terminals with the mounting substrate, onto the circuit tape.

The reflow characteristics and connection reliability of the lead and the solder bump of the obtained semiconductor device were confirmed by the same method as the embodiment 1.

(Embodiment 12)

A polyamic acid was prepared by reacting an equivalent of benzophenone tetracarboxylic acid dianhydride (made by Wako Pure Chemicals) and bis(4(2-aminophenoxyphenyl) ether) (synthetic chemical) at 5° C. in dimethylacetamide. Then, the reactant was heated at 250° C. to obtain polyimide. The obtained polyimide 100 g was mixed with 4,4'-glycidyl-3,3', 5,5'-tetramethylbiphenylether (made by Yuka Shell) 19.5 g, phenol novolac (made by Meiwa Kasei) 10.6 g, and triphenylphosphate (made by Wako Pure Chemicals) 0.2 g as a catalyst in dimethylacetamide to obtain a varnish containing a non-volatile component of 20% by weight. A film 100 µm thick was prepared with the obtained varnish.

The prepared film was registered and adhered to the circuit tape. The adhesion condition was at 170° C. for ten seconds with a pressure of 30 kgf/cm². Under the above conditions, the unadhered portion of the adhesive layer had a sufficient adhering force to adhere to a semiconductor element. The adhesion of the circuit tape with the film material to the semiconductor element was conducted at 200° C. for one minute with a pressure of 30 kgf/cm². Subsequently, a post-curing was performed at 200° C. for 60 minutes in a constant temperature bath. Then, connecting leads on the circuit tape were electrically connected to pads of the semiconductor element by gang bonding. The connecting portion was encapsulated with an epoxy encapsulant (made by Hitachi Chemical Co., Ltd. RC021C). Finally, the semiconductor device shown in FIG. 6-2 was obtained by fixing the solder balls, which serve as connecting terminals with the mounting substrate, onto the circuit tape.

The reflow characteristics and connection reliability of the lead and the solder bump of the obtained semiconductor device were confirmed by the same method as the embodiment 1.

(Embodiment 13)

A film having a three layer structure was prepared by applying the varnish obtained in the embodiment 12 onto the one surface of polyimide film (made by Ube Kosan Co. Ltd., SGA, 50 µm thick) to a thickness of 20 µm (thermosetting resin component), and the fluorine-containing polyimide, i.e. the varnish prepared in the embodiment 7, (the reactant of hexafluorobisphenol AF and bis(4-aminophenoxyphenyl) hexafluoropropane, with a glass transition temperature of 260° C.) was applied onto the other surface of the polyimide film to a thickness of 10 µm (thermoplastic resin component). The film was registered and adhered to the circuit tape at the surface where the thermosetting resin component was applied. The adhesion condition was at 170° C. for 10 seconds with a pressure of 30 kgf/cm². Then, a post-curing was performed at 200° C. for 60 minutes in a constant temperature bath. Subsequently, the semiconductor element was adhered to the surface where the thermoplastic resin component was applied. The adhesion condition was at 350° C. for 2 seconds with a pressure of 80 kgf/cm². Then, connecting leads on the circuit tape were electrically connected to pads of the semiconductor element by gang bonding. The connecting portion was encapsulated with an epoxy encapsulant (made by Hokuriku Toryo chip coat 8107). Finally, the semiconductor device shown in FIG. 6-2 was obtained by fixing the solder balls, which serve as connecting terminals with the mounting substrate, onto the circuit tape.

The reflow characteristics and connection reliability of the lead and the solder bump of the obtained semiconductor device were confirmed by the same method as the embodiment 1.

COMPARATIVE EXAMPLE 1

An elastomer of 150 µm thickness was formed by registering silicone resin (made by Toray Dow Corning Silicone Co. Ltd., JCR 6126) with the circuit tape and printing using metal masks. After the formation, post-curing was performed at 150° C. for 60 minutes in a constant temperature bath. Then, the flatness of the elastomer was determined using a laser film thickness measuring apparatus. A silicone adhesive agent (made by Sinetsu Chemical Co. Ltd., KE 1820) was applied onto the surface of the elastomer to a thickness of 20 µm as an adhesive layer for causing the semiconductor element to adhere to the circuit tape having the elastomer, and the circuit tape was registered and adhered to the semiconductor element. The adhesion was carried out at 150° C. for one minute with a pressure of 30 kgf/cm². Then, connecting leads on the circuit tape were electrically connected to pads of the semiconductor element by gang bonding. The connecting portion was encapsulated with a silicone encapsulant (made by Toshiba Silicone, TSJ 3150). Finally, the semiconductor device shown in FIG. 6-1 was obtained by fixing the solder balls, which serve as connecting terminals with the mounting substrate, onto the circuit tape.

The reflow characteristics and connection reliability of the lead and the solder bump of the obtained semiconductor device were confirmed by the same method as the embodiment 1.

COMPARATIVE EXAMPLE 2

A film having a three layer structure was prepared by applying a thermoplastic resin (polyamide 12, m.p. 175° C.)

having a melting point equal to or lower than 200° C. onto both surfaces of a polyimide film (made by Ube Kosan Co. Ltd., SGA, 50 μm thick) as adhesive layers (30 μm thick). The film having the three layer structure was used to prepare a semiconductor device using the same method as the embodiment 1, and the reflow characteristics and connection reliability of the lead and the solder bump of the obtained semiconductor device were confirmed by the same method as the embodiment 1.

COMPARATIVE EXAMPLE 3

A film having a three layer structure was prepared by applying an epoxy resin (made by Hitachi Chemical Co., Ltd., R021C) having a high modulus of elasticity at room temperature onto both surfaces of a polyimide film (made by Ube Kosan Co. Ltd., SGA) as adhesive layers (20 μm thick). The film having the three layer structure was used to prepare a semiconductor device by the same method as the embodiment 1, and the reflow characteristics and connection reliability of the lead and the solder bump of the obtained semiconductor device were confirmed by the same method as the embodiment 1.

TABLE 1

| | Elastic modulus (MPa) | | | Thermal cycling test (1000 cycles) | |
|---|---|---|---|---|---|
| | Adhesive film (25° C.) | Adhesive layers (average of 200–250° C.) | Reflow test | Lead open failure (%) | Bump open failure (%) |
| Emb. * 1 | 788 | 4.3 | No void | 0 | 0 |
| Emb. 2 | 5000 | 1.5 | No void | 0 | 0 |
| Emb. 3 | 960 | 3.6 | No void | 0 | 0 |
| Emb. 4 | 4190 | 3.6 | No void | 0 | 0 |
| Emb. 5 | 3750 | 13 | No void | 0 | 0 |
| Emb. 6 | 3500 | 100 | No void | 0 | 0 |
| Emb. 7 | 3500 | 2000, 15 | No void | 0 | 0 |
| Emb. 8 | 10 | 2.5 | No void | 0 | 0 |
| Emb. 9 | 2000 | 100 | No void | 0 | 0 |
| Emb. 10 | 20 | 2.5 | No void | 0 | 0 |
| Emb. 11 | 30 | 3.5 | No void | 0 | 0 |
| Emb. 12 | 850 | 8.5 | No void | 0 | 0 |
| Emb. 13 | 3300 | 2000, 8.5 | No void | 0 | 0 |
| Com. ※1 | 10 | 2.5 | No void | 10 | 0 |
| Com. 2 | 1400 | ~0 | Void | 5 | 0 |
| Com. 3 | 11000 | 1100 | No void | 80 | 100 |

*: Embodiment,
※: Comparative example.

Flatness of the elastomer: High and low difference of comparative example 1 was 50 μm to thickness of 150 μm, and all other samples within 5 μm.

Reflow test condition: Pretreatment: 85° C./85% RH, 48 hours, Water absorption 240° C.×3 times, Infrared oven.

In accordance with the present invention, a semiconductor device is provided, wherein tape material having a circuit layer and a semiconductor element are electrically connected, an external terminal for effecting electrical connection with the mounting substrate is provided on the circuit tape, and a film material is used as the material for bonding the circuit tape and the semiconductor element in an insulating manner, resulting in a semiconductor device which is superior in anti-reflow property due to the use of the film material for the adhesion, of which the modulus of elasticity in the reflow temperature range is at least 1 MPa. A manufacturing method is also provided which is superior in mass productivity by using a film material at a portion for buffering thermal stress generated by a difference in thermal expansion of the semiconductor element and the mounting substrate.

The film material is superior in flatness, and a high and low difference within 5 μm can be ensured for a thickness of 150 μm, and so a manufacturing method which is superior in workability can be provided. In accordance with the stress buffering effect of the film material, the connection reliability of both the lead portion which electrically connects the circuit tape and the semiconductor element, and the bump which electrically connects the semiconductor device and the mounting substrate can be satisfied simultaneously in a temperature cycling test.

What is claimed is:

1. A semiconductor device, comprising:
   a semiconductor element;
   a circuit tape having a circuit layer;
   external terminals for electrically connecting said circuit tape to a mounting substrate; and
   an adhesive film for adhering said circuit tape to said semiconductor element such that the semiconductor element is insulated from the circuit tape, wherein
   said circuit layer is connected to a pad of said semiconductor element and said external terminal, and
   an elastic modulus of said adhesive film in a temperature region of 200°–250° C. is more than 1 MPa.

2. A semiconductor device as claimed in claim 1, wherein said adhesive film is composed of a three-layer structure having a supporting layer and two adhesive layers which are applied respectively onto both sides of said supporting layer.

3. A semiconductor device as claimed in claim 1, wherein said circuit layer of said circuit tape is connected to said pad of said semiconductor element by wire bonding.

4. A semiconductor device as claimed in claim 1, wherein said elastic modulus of said adhesive film at room temperature is equal to or less than 4000 MPa.

5. A semiconductor device as claimed in claim 1, wherein a portion of said pad of said semiconductor element connecting to said circuit layer of said circuit tape is sealed with an insulating material.

6. A semiconductor device as claimed in claim 1, wherein an elastic modulus of the adhesive film at room temperature is higher than the elastic modulus of said adhesive film in the temperature range of 200°–250° C.

7. A semiconductor device as claimed in claim 1, wherein the adhesive film has a layer of a thermoplastic resin, and the thermoplastic resin has a glass transition temperature greater than 250° C.

8. A semiconductor device as claimed in claim 1, wherein material of the adhesive film has a coefficient of moisture absorption at 85° C./85% RH for 168 hours of, at most, 3%.

9. A semiconductor device as claimed in claim 1, wherein the adhesive film includes a thermosetting resin closest to the circuit tape and a thermoplastic resin closest to the semiconductor element.

10. A semiconductor device as claimed in claim 1, wherein the circuit tape has an uneven surface with spaces between portions of the circuit layer, and the adhesive film fills in the spaces.

11. A semiconductor device as claimed in claim 5, wherein said insulating material is made of an epoxy material.

12. A semiconductor device, comprising:
   a semiconductor element;
   a circuit tape having a circuit layer on a dielectric film;
   an adhesive film for adhering said semiconductor element to said circuit tape such that the semiconductor element is insulated from the circuit tape; and external terminals for electrically connecting said circuit tape to a mounting substrate, wherein an elastic modulus of said adhesive film in a temperature region of 200°–250° C. is more than 1 MPa, said circuit layer is connected to a plane having a pad of said semiconductor element via said adhesive film, a connecting lead on said circuit tape is connected to said pad of said semiconductor element, and said external terminals for electrically connecting said circuit tape to said mounting substrate are formed on said circuit tape.

13. A semiconductor device as claimed in claim 12, wherein said elastic modulus of said adhesive film at room temperature is equal to or less than 4000 MPa.

14. A semiconductor device as claimed in claim 12, wherein a portion of said pad of said semiconductor element connecting to said circuit layer of said circuit tape is sealed with an insulating material.

15. A semiconductor device as claimed in claim 12, wherein a portion of said pad of said semiconductor element connecting to said circuit layer of said circuit tape is sealed with resin.

16. A semiconductor device, comprising:

a semiconductor element;

a circuit tape having a circuit layer on a dielectric film;

an adhesive film for adhering said semiconductor element to said circuit tape such that the semiconductor element is insulated from the circuit tape; and external terminals for electrically connecting said circuit tape to a mounting substrate, wherein plural pads are provided at a middle or a periphery of said semiconductor element, an elastic modulus of said adhesive film in a temperature region of 200°–250° C. is more than 1 MPa, said circuit layer is connected to a plane having said pads of said semiconductor element via said adhesive film, connecting leads on said circuit tape are respectively connected to said pads of said semiconductor element, and said external terminals for electrically connecting said circuit tape to said mounting substrate are formed on said circuit tape.

17. A semiconductor device as claimed in claim 16, wherein said external terminals for connecting to said mounting substrate are formed at a bottom side of said semiconductor element.

18. A semiconductor device as claimed in claim 16, wherein said external terminals for connecting to said mounting substrate are formed at an exterior side of said semiconductor element.

19. A semiconductor device as claimed in claim 16, wherein said external terminals for connecting to said mounting substrate are formed at a respective one of a bottom side and an exterior side of said semiconductor element.

20. A semiconductor device as claimed in claim 16, wherein a portion of each of said pads of said semiconductor element connecting to said circuit layer is sealed with an insulating material.

21. A semiconductor device as claimed in claim 16, wherein said elastic modulus of said adhesive film at room temperature is equal to or less than 4000 MPa.

22. A semiconductor device, comprising:

a semiconductor element;

a circuit tape having a circuit layer on a dielectric film;

an adhesive film for adhering said semiconductor element to said circuit tape such that the semiconductor element is insulated from the circuit tape;

external terminals for electrically connecting said circuit tape to a mounting substrate; and an outer frame covering planes of said semiconductor element except one plane, wherein plural pads are provided at a periphery of said semiconductor element which is not covered with said outer frame, said plural pads being provided in a plane, said circuit tape is connected to the plane having said pads of the semiconductor element, and to said outer frame arranged at an outer side of the plane having said pads, by said adhesive film, an elastic modulus of said adhesive film in a temperature region of 200°–250° C. is more than 1 MPa, said circuit layer of said circuit tape is connected to said plural pads of said semiconductor element, a portion of each of said pads of said semiconductor element connecting to said circuit layer is sealed with an insulating material, and said plural external terminals for electrically connecting said circuit tape to said mounting substrate are formed on said circuit tape arranged at the outer frame.

23. A semiconductor device, comprising:

a semiconductor element;

a circuit tape having a circuit layer on a dielectric film;

an adhesive film for adhering said semiconductor element to said circuit tape such that the semiconductor element is insulated from the circuit tape;

external terminals for electrically connecting the circuit tape to a mounting substrate; and an outer frame covering planes of said semiconductor element except one plane, wherein plural pads are provided at a periphery of said semiconductor element which is not covered with said outer frame, said plural pads being provided in a plane, said circuit tape is connected to the plane having said pads of the semiconductor element, and to said outer frame arranged at an outer side of the plane having said pads, by said adhesive film, an elastic modulus of said adhesive film in a temperature region of 200°–250° C. is more than 1 MPa, said circuit layer of said circuit tape is connected to said plural pads of said semiconductor element, a portion of each of said pads of said semiconductor element connecting to said circuit layer is sealed with an insulating material, and said plural external terminals for electrically connecting to said mounting substrate are formed on said circuit tape arranged both at the outer frame and at the semiconductor element.

* * * * *